(12) United States Patent
Zommer

(10) Patent No.: US 6,642,551 B2
(45) Date of Patent: Nov. 4, 2003

(54) STABLE HIGH VOLTAGE SEMICONDUCTOR DEVICE STRUCTURE

(75) Inventor: Nathan Zommer, Los Altos, CA (US)

(73) Assignee: IXYS Corporation, Santa Clara, CA (US)

( * ) Notice: Subject to any disclaimer, the term of this patent is extended or adjusted under 35 U.S.C. 154(b) by 0 days.

(21) Appl. No.: 09/938,272

(22) Filed: Aug. 23, 2001

(65) Prior Publication Data

US 2002/0068404 A1 Jun. 6, 2002

Related U.S. Application Data

(60) Continuation of application No. 09/268,858, filed on Mar. 15, 1999, now Pat. No. 6,306,728, which is a continuation of application No. 08/762,651, filed on Dec. 9, 1996, now Pat. No. 5,904,544, which is a division of application No. 08/332,526, filed on Jan. 17, 1995, now Pat. No. 5,629,552.

(51) Int. Cl.⁷ .............................................. H01L 29/423
(52) U.S. Cl. ...................... 257/127; 257/315; 257/488; 257/630; 257/638
(58) Field of Search ................... 257/127, 315, 257/488, 630, 638

(56) References Cited

U.S. PATENT DOCUMENTS

| | | | |
|---|---|---|---|
| 4,399,449 A | * | 8/1983 | Herman et al. ............. 257/490 |
| 4,419,684 A | | 12/1983 | Sakai et al. |
| 4,468,686 A | * | 8/1984 | Rosenthal .................... 257/487 |
| 4,573,066 A | | 2/1986 | Whight |
| H40 H | | 4/1986 | Buchanan, Jr. et al. |
| 4,691,224 A | * | 9/1987 | Takada ........................ 257/495 |
| 4,757,363 A | * | 7/1988 | Bohm et al. ................. 257/358 |
| 5,043,781 A | * | 8/1991 | Nishiura et al. ............. 257/296 |
| 5,094,965 A | | 3/1992 | Ozaki et al. |
| 5,101,244 A | | 3/1992 | Mori et al. |
| 5,279,984 A | | 1/1994 | Kinoshita et al. |
| 5,334,546 A | | 8/1994 | Terashima |
| 5,434,445 A | * | 7/1995 | Ravanelli et al. ........... 257/488 |
| 5,521,419 A | | 5/1996 | Wakamiya et al. |
| 5,731,627 A | * | 3/1998 | Seok .......................... 257/630 |
| 5,904,544 A | | 5/1999 | Zommer |
| 6,306,728 B1 | | 10/2001 | Zommer |

* cited by examiner

*Primary Examiner*—Richard Elms
*Assistant Examiner*—Douglas M Menz
(74) *Attorney, Agent, or Firm*—Townsend and Townsend and Crew LLP

(57) ABSTRACT

A power integrated circuit device with multiple guard rings and field plates overlying regions between each of the guard rings. Each of the field plates form overlying a dielectric layer also between each of the guard rings. Multiple field plates can exist between each of such guard rings. At least one field plate couples to a main junction region, and another field plate couples to a peripheral region, typically a scribe line. The present power device structure with multiple guard rings and field plates provides a resulting guard ring structure which allows for such device to achieve higher voltage applications.

19 Claims, 5 Drawing Sheets

STABLE HIGH VOLTAGE SEMICONDUCTOR DEVICE STRUCTURE

This is a continuation of U.S. patent application Ser. No. 09/268,858, now U.S. Pat. No. 6,306,728, filed on Mar. 15, 1999, which is a continuation of U.S. application Ser. No. 08/762,651, filed Dec. 9, 1996, now U.S. Pat. No. 5,904,544 which is a divisional of U.S. application Ser. No. 08/332, 526, filed Jan. 17, 1995, now U.S. Pat. No. 5,629,552, all of which are incorporated by reference herein for all purposes.

BACKGROUND OF THE INVENTION

The present invention relates to integrated circuit devices, and in particular high voltage semiconductor switching devices such as high voltage transistors, power MOSFETs, power IGBTs, thyristors, MCTs, and the like (hereinafter called power devices).

Conventional power devices are fabricated by conventional semiconductor processing techniques on a single crystalline semiconductor substrate such as a silicon wafer. Conventional semiconductor processing techniques include doping and implanting, lithography, diffusion, chemical vapor deposition (CVD), wet and dry etching, sputtering, epitaxy, oxidizing, among others. A complex sequence of these processing techniques is often required to produce is a high voltage device having a breakdown voltage within the 30 to 1200 volt range.

A limitation with the conventional power device is its shallow junction region. The shallow junction region often creates low junction curvature and reduces the breakdown voltage of the device. This lower breakdown voltage is often an undesirable result for high voltage applications.

Industry has proposed or even attempted to overcome such limitation with use of a guard ring formed adjacent to the main junction of the power device. The guard ring typically provides a junction termination technique for the convention power device. A conventional guard ring is often formed by selectively placing certain dopants around the periphery of the main junction, typically in a "race track" or "ring" type pattern. The dopants often include impurities of the same impurity type as the main junction. Ideally, the guard ring keeps the main junction in its place.

However, as industry demands for power devices with even higher breakdown voltages and even smaller device features, the presence of contamination on certain portions of a convention guard ring structure detrimentally effects an electric field therein, thereby degrading the breakdown voltage of the device. Accordingly, the presence of contamination often creates a resulting power device that is unstable, unreliable, or the like.

Another technique often used to preserve the breakdown voltage of the device is to form a field plate located between certain guard rings for the purpose of reducing electric fields thereby. The field plate is formed overlying an oxide layer, also located overlying regions between the guard rings. Ideally, lower electric fields at such location should tend to increase the breakdown voltage of the device. However, a limitation with the field plate structure often occurs with power devices having higher breakdown voltages.

For example, power devices with even higher breakdown voltages produce an even higher electric field underneath portions of the oxide layer. The higher electric field generally promotes certain hot electron effects such as electrons being injected and trapped into portions of the oxide layer, and the like. As charge builds up in the oxide layer from the trapped electrons, the conventional device often experiences detrimental effects such as current leakage, voltage instability, unreliability, and the like.

From the above, it is seen that a method and structure for providing a device with a high breakdown voltage that is easy to manufacture, reliable, and cost effective is often desired.

SUMMARY OF THE INVENTION

The present invention provides an power integrated circuit device with a combination of multiple guard rings and field plates for the purpose of achieving high voltage applications. Benefits of the present invention are achieved in the context of known technology.

The present invention provides a power device that includes a semiconductor substrate having a top surface with an active region, a guard ring region, and a peripheral region. The active region includes a junction region. The present power device also includes a plurality of guard rings formed onto the semiconductor substrate in the guard ring region, typically located between the active region and the peripheral region. The plurality of guard rings has a first guard ring nearest to the junction region and a last guard ring nearest to the peripheral region. The present power device further has a dielectric layer overlying the top surface and having portions between each of the plurality of guard rings. The dielectric layer also includes a portion between the junction region and the first guard ring, and another portion between the last guard ring and the peripheral region. A field plate layer is also provided. The field plate layer is overlying each of the dielectric layer portions between each of the plurality of guard rings. The field plate layer is also overlying the dielectric layer portion between the junction region and the first guard ring. The field plate layer further overlies the dielectric layer portion between the last guard ring and the peripheral region.

In an alternative embodiment, the present invention provides a power device with a semiconductor substrate that includes a top surface with an active region, a guard ring region, and a peripheral region. The active region includes a junction region. The present power device also includes a plurality of guard rings formed onto the semiconductor substrate in the guard ring region. The guard ring region is located between the active region and the peripheral region. The plurality of guard rings includes at least a first guard ring nearest to the junction region and a last guard ring nearest to the peripheral region. A dielectric layer overlying the top surface and having portions between each of the plurality of guard rings is also provided. The dielectric layer also has a portion between the junction region and the first guard ring. A dielectric layer portion between the last guard ring and the peripheral region is further provided. The present power device includes a field plate layer. The field plate layer has a plurality of field plates overlying each of the dielectric layer portions between each of the plurality of guard rings, and a field plate located between the junction region and the first guard ring. The field plate layer also includes a plurality of field plates overlying the dielectric layer portion between the last guard ring and the peripheral region.

In a further alternative embodiment, the present invention provides a method of forming a guard ring structure. The present method includes providing a partially completed semiconductor device with an active region, guard ring region, and peripheral region. The active region includes a junction region, and the guard ring region exists between the active region and the peripheral region. The guard ring region also has a plurality of diffusion region. The present method also includes steps of forming a dielectric layer overlying the partially completed semiconductor substrate, and forming a field plate layer overlying the dielectric layer. A step of defining the dielectric layer and field plate layer to form a plurality of openings over the diffusion regions is also provided. The dielectric layer and field plate layer is also defined to expose the junction region and the peripheral region. The present method further has a step of providing implants into the openings to define a plurality of guard rings. The plurality of guard rings includes at least a first guard ring proximate to the junction region and a last guard ring proximate to the peripheral region.

A further understanding of the nature and advantages of the present invention may be realized by reference to the latter portions of the specification and attached drawings.

DESCRIPTION OF THE SPECIFIC EMBODIMENT

Prior Art Guard Ring Structures

Figure 1:
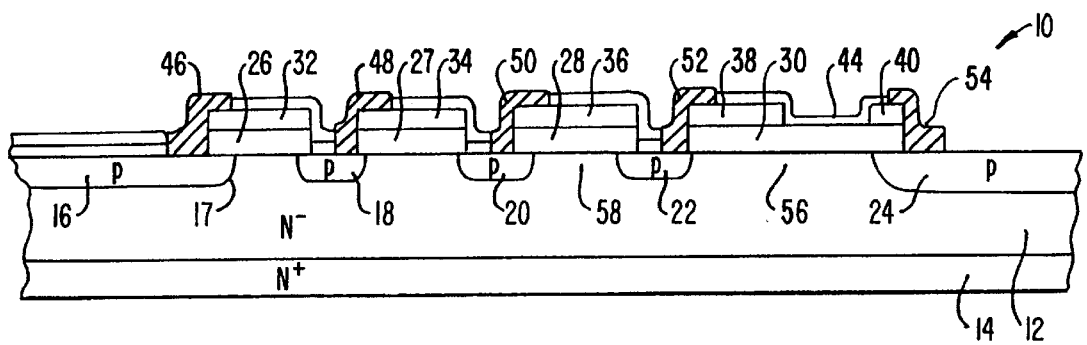
FIG. 1 is a simplified cross-sectional view of a portion of a conventional power device.

FIG. 1 is a simplified cross-sectional view of a prior art guard ring structure 10 for a conventional power device. The conventional power device includes an N– type epitaxial layer 12 formed on an N+ type semiconductor substrate 14. The guard ring structure may have certain P type regions defined in the N– type epitaxial layer 12. Typically the P type regions include a main blocking region 16, multiple guard rings 18, 20, and 22, and a scribe region 24. A field oxide layer is often defined overlying regions between each of the aforementioned P type regions. The field oxide layer includes oxide regions 26, 27, 28, and 30. The guard ring structure also includes a field layer defined by field plate 32, 34, 36, 38, and 40 formed over each of the field oxide regions. A metal layer used as contacts are also formed overlying portions of certain guard rings and portions of certain field plates. The metal layer includes metal contacts 46, 48, 50, 52, and 54. An exposed annular oxide region 44 is defined between field plate 38 and 40, typically isolating such structures to provide a high voltage difference therebetween.

The guard ring structure is designed to reduce the electric field of the main junction region and thereby provide for a higher breakdown voltage. This often occurs by providing a higher junction curvature. Otherwise, a low junction curvature caused by a shallow junction may reduce the breakdown voltage of the device. Ideally, the highest voltage potential in a conventional device exists at the backside of the N+ substrate and the scribe region 54, typically a front surface portion of the N+ substrate. The lowest voltage potential exists at the main P type junction 17, and such voltage potential increases from such main junction in the N– region to an edge of the die, typically the scribe region for an N channel device.

The voltage potential at each guard ring for a given applied reverse voltage is typically based at least upon the distance between each guard ring and the main P type junction. For example, guard rings further from the main junction often have a higher voltage potential and therefore a higher applied reverse voltage than guard rings closer to the main P type junction. In such example, a depletion region spreads from the main P type junction 16 to outer N– type regions of the die.

However, the annular oxide region 44 is often exposed and subject to contamination from particles, ionic species, and others that may come in contact with such region. Typically the presence of contamination occurs with the use of non-hermetically sealed packages such as plastic molded packages, modules, hybrids, bare dice on substrates, and others. The contamination often modifies an electric field in the semiconductor under such annular oxide region 44, typically at region 56, and thus changes the breakdown voltage of the device to create problems such as unreliability, instability, among others.

Figure 1A:
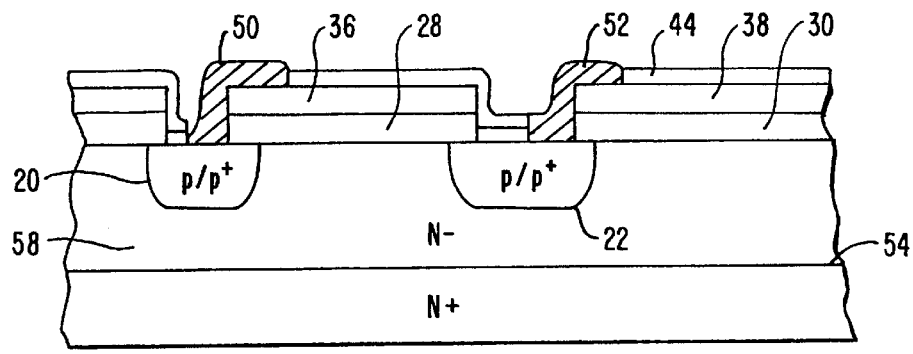
FIG. 1A is an enlarged cross-sectional view of a portion of the device of FIG. 1.

Another limitation with the prior art device of FIG. 1 may be illustrated by FIG. 1A, an enlarged cross-sectional view of a portion of the device of FIG. 1. The same reference numerals are used for easy cross-reference. As shown, field plate 36 connects to guard ring 20 through metal contact 50. Accordingly, about the same voltage potential exists at both field plate 36 and guard ring 20. As discussed, guard ring 22 includes a higher voltage potential than guard ring 20 and so on. This means the voltage potential at the N– type region 58 can be much higher than the voltage potential at guard ring 20, but slightly lower than the voltage potential at guard ring 22. Since field plate 36 has about the same voltage potential as guard ring 20, a higher voltage drop develops at the field oxide region 28 between such field plate 36 and guard ring 22. In addition, a higher voltage drop also develops at the field oxide region 28 between such field plate 36 and N– type region 58.

The higher voltage drop from the field plate 36 contributes an electric field component in the N– type region 58, in addition to the field created by the given reverse voltage applied to such device. The electric fields create hot electron effects such as the injection and trapping of hot electrons into the field oxide 28, typically near the guard ring 22. Accordingly, the higher voltage drop generally leads to an increase charge build up at the oxide region 28, often contributing leakage currents that drift up with time while the device is under reverse bias. Such leakage currents may create problems such as apparent instability, long term device degradation, device damage, and others.

A further limitation typically occurs when the distance between guard rings 20 and 22 effectively increases. This increases the electric field of certain portions of the device beyond the critical "avalanche field." In such instance, localized device breakdown can occur at lower than normal applied voltage values, often creating problems such as device failure, destruction, and others.

Figure 2:
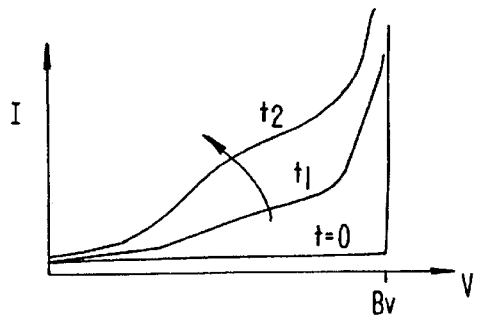
FIGS. 2 and 3 illustrate typical current and voltage diagrams for conventional power devices.
Figure 3:
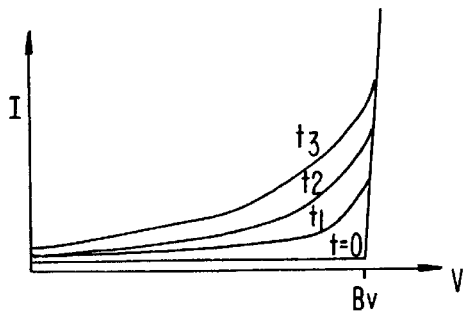

FIGS. 2 and 3 illustrate current and voltage diagrams of conventional power devices as compared to an ideal power device. The conventional power device may be a high voltage MOSFET, IGBT, or other semiconductor switching devices. The conventional power device includes certain guard rings and field plates. As shown, current leakage increases with time due to the higher voltage drop between the field plate and underlying semiconductor (also known as field concentration effects) illustrated by FIG. 2. For t>0, the current fluctuates with respect to voltage. For example, each of the current/voltage plots at $t_1$, and $t_2$ illustrate fluctuating values of voltage with respect to current. FIG. 3 illustrates the effects of surface contamination in the oxide of the annular region. For t>0 and a given reverse voltage, the "leakage" current across the device increases, which is a typical sign of degradation. Ideally, in both of the FIGS., the current should follow the current/voltage path represented at time=0 (t=0).

Present Guard Ring Structures

Figure 4:
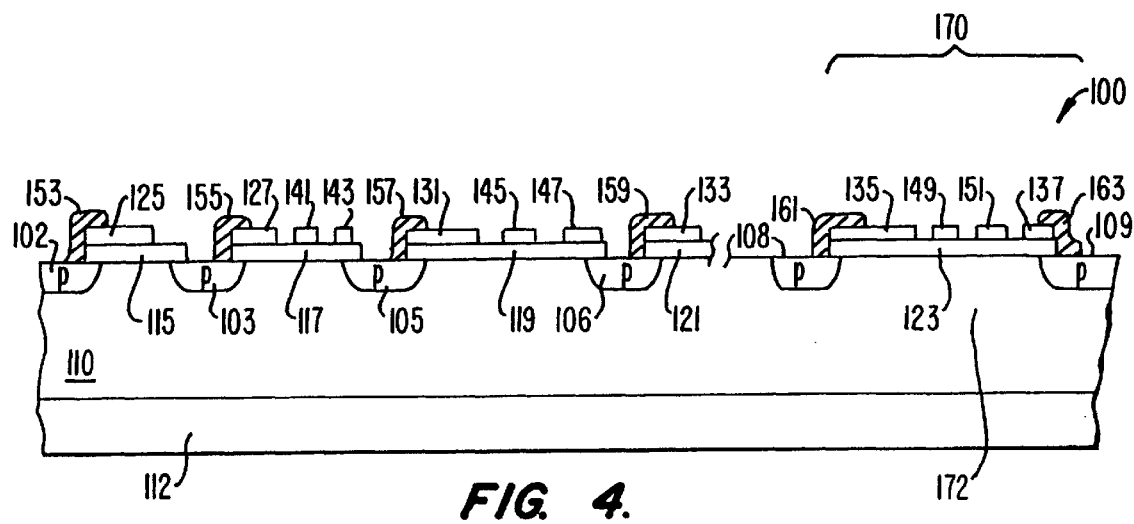
FIG. 4 is a simplified cross-sectional view of an embodiment of a guard ring structure according to the present invention.

FIG. 4 is a simplified cross-sectional view of an embodiment 100 of a guard ring structure according to the present invention. This embodiment uses P type main junction regions and guard rings formed onto an N+ type substrate for illustrative purposes only. It will be recognized that such an embodiment may also be formed with use of N type main junction regions and guard rings, and others. The guard ring structure includes P type regions 102, 103, 105, 106, 108, 109, and others formed on an N− type epitaxial layer 110. The N− type epitaxial layer is defined on an N+ type substrate 112. P type regions 102, 103, 105, and 106 each define guard rings. As for P type region 109, it typically defines a portion of a scribe line. An insulting layer forms insulating regions 115, 117, 119, 121, 123, and others. A field plate layer forms fixed field plate regions 125, 27, 131, 133, 135, 137, and others. Floating field plate regions 141, 143, 145, 147, 149, and 151 are defined from the field plate layer. The guard ring structure also includes a metallization layer that forms contacts 153, 155, 157, 159, 161, 163, among others.

The N type substrate can be any suitable substrate for use with high voltage applications. The N type substrate is often a neutron transmuted substrate, epitaxial, or any substrate capable of achieving high voltage applications. The substrate is often composed of one or more layers of different doping types or dopant concentrations. "EPI" substrates (i.e., epitaxial), as an example, are composed of an N+ substrate onto which more layers at different dopants and concentrations are grown. Typically the substrate includes a thickness ranging from about 0.1 mm to about 0.7 mm, depending on the wafer diameter and application, and preferably at about 0.5 mm for a 125 mm diameter wafer. The impurity concentration of such substrate is varied, according to the specific layer. The N+ region is typically of $10^{17}$ atoms/cm$^3$ of silicon, while the N− layer might be typically at $10^{13}$–$10^{14}$ atoms/per cm$^3$ silicon. Of course, the concentration and thickness of such substrate depends upon the particular application.

P type regions defined in the N− type layer typically form by way of masking, implantation, diffusion, and the like. Preferably, the P type regions are P+/P− type regions. Each of the P type regions 102, 103, 105, 106, 108, and others define a guard ring or the like. A distance ranging from about 3 µm to about 100 µm. The guard ring spacing depends on the ring number and the desired voltage rating. For high voltage applications, the distance between each guard ring is 3–10 µm on the average, and preferably in an increasing sequence from first to last ring. The distance between each of the guard rings may be a constant, increasing, decreasing, combinations thereof, or the like. Each guard ring may be floating, that is, not specifically connected to any other well structure. Of course, the configuration of each P type region depends upon the particular application.

The dielectric layer overlying regions between each of the guard rings include materials such as silicon dioxide, silicon nitride, combinations thereof, and the like. Preferably, silicon dioxide is used at a thickness ranging from about 0.04 µm to about 2.5 µm, and preferably about 0.1 µm to about 1.5 µm.

Field plates include fixed field plates 125, 127, 131, 133, 135, 137, and others, and floating field plates 141, 143, 145, 147, 149, and 151. The connected field plates connect to an adjacent guard ring by way of contact metalization. For example, field plate 125 couples to guard ring 102 by use of contact 153, field plate 127 couples to guard ring 103 by use of contact 155, field plate 131 couples to guard ring 105 by use of contact 157, field plate 133 couples to guard ring 106 by use of contact 159, and so on. The other field plates 141, 143, 145, 147, 149, 151, and others are typically called floating field plates, that is, each of such field plates do not couple to a guard ring. The field plates can be made from any suitable metal material, polysilicon, suicides, combinations thereof, and the like. The field plate may also be doped or undoped, depending upon the application. The distance separating field plates on each insulating region ranges from about 25 µm to about 1 µm or less.

The series of field plates 135, 149, 151, and 137 located at an outer periphery 170 of the semiconductor preferably has at least two field plates coupled to certain portions of the semiconductor. As noted, field plate 135 couples to guard ring 108 by use of contact 161. Field plates 149 and 151 are floating, and field plate 137 couples to p type region 109, often defining the scribe region. Preferably, the distance between each such field plates is no greater than about 4 µm, the width of each of such field plates ranges from about 32 µm to about 2 µm or less. The configuration of field plates in region 170 provides for a more uniform distribution of electric fields in region 172, thereby providing for higher voltage applications.

The presence of multiple field plates in the aforementioned configuration provides a guard ring structure that reduces the electric field underlying certain portions of the dielectric regions. The reduced electric field preserves the breakdown voltage of the present power device structure. By way of this configuration, breakdown voltages ranging from about 50 volts to about 5000 volts may be achieved.

Figure 5:
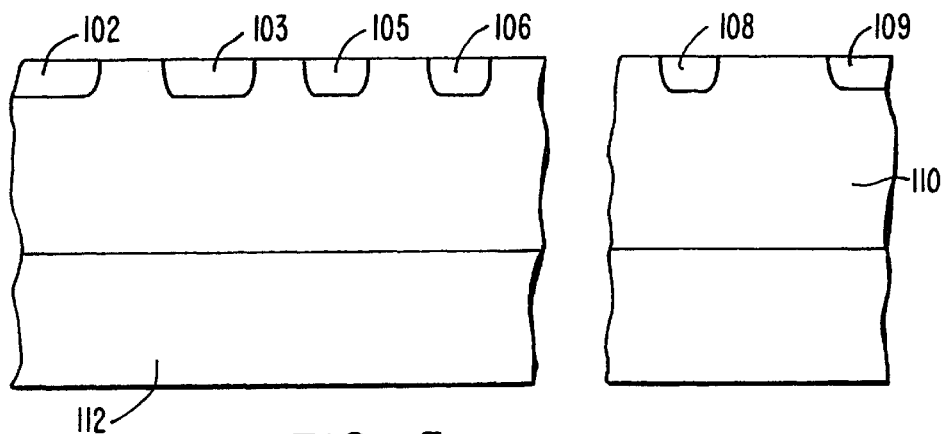
FIGS. 5–8 illustrate a simplified fabrication method for the guard ring structure of FIG. 4.

In an alternative embodiment, FIGS. 5–8 illustrate a simplified fabrication method for the guard ring structure of FIG. 4. The fabrication method begins by providing a silicon substrate, preferably an N+ type silicon substrate, and more preferably an neutron transmuted N+ type silicon substrate. After conventional polishing and cleaning routines, an N+ type epitaxial is defined onto a top surface of the N+ type silicon substrate. FIG. 5 illustrates a simplified cross-sectional view of a N+ type silicon substrate 112 and an N− type epitaxial layer 110.

An implant step forms P type well regions, guard ring regions, and others onto the N− type epitaxial layer. Typically the surface of such N− type epitaxial layer is oxidized, masked, and implanted to form P type well regions and P type guard ring regions 102, 103, 105, 106, and 108. A step of diffusion may be subsequent to the implant step to diffuse the P type impurities, typically boron or the like. The concentration of the P type impurities ranges from about $10^{14}$ atoms/cm$^3$ to about $10^{18}$ atoms/cm$^3$, and preferably at about $10^{17}$ atoms/cm$^3$. An N type implant is then often performed at channel regions of for example a power MOSFET device. Of course, the particular concentration used depends upon the particular application.

Figure 6:
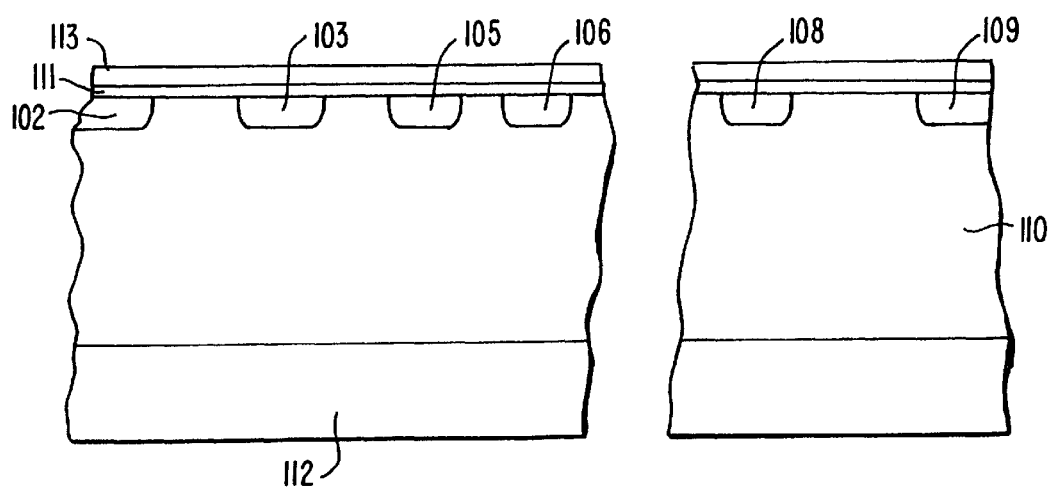
Figure 7:
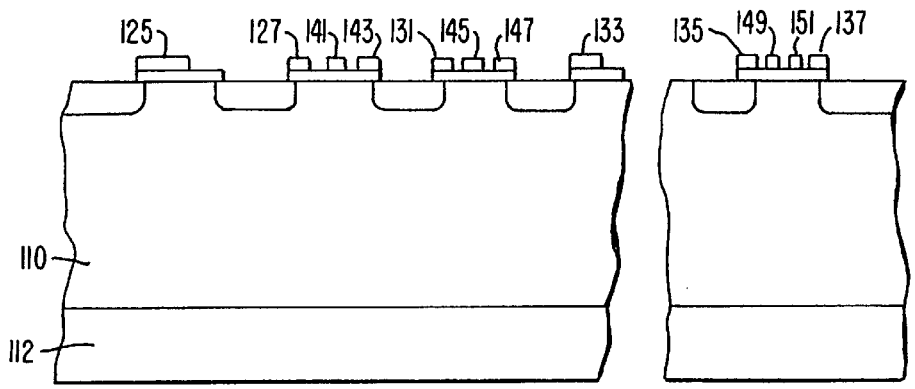
Figure 12:
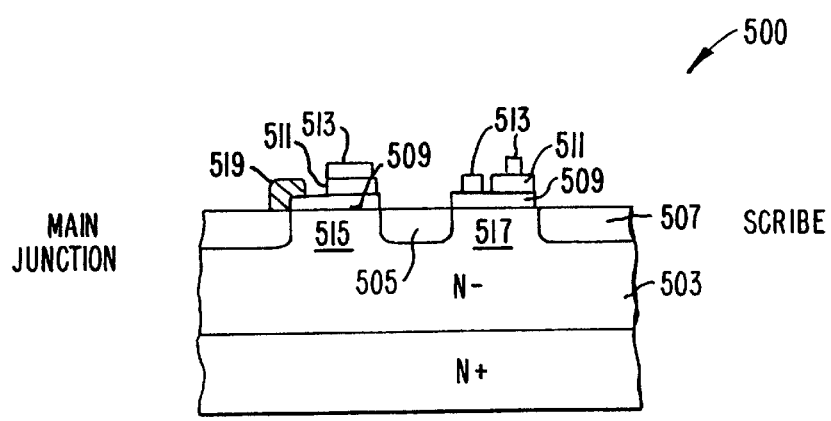
FIG. 12 is a simplified cross-sectional view of an alternative embodiment of the present invention.

A dielectric layer 111 of one or more thicknesses also known as a gate dielectric layer, preferably silicon dioxide, is then formed overlying the top surface of the structure of FIG. 5 as illustrated by FIG. 6. A silicon dioxide layer has a thickness ranging from about 0.05 $\mu$m to about 2.5 $\mu$m, and preferably at about 1.5 $\mu$m. The dielectric layer can be in steps under the field plate, of various step height as shown in FIG. 12. A field plate layer 113 such as a polysilicon layer or the like is defined overlying the oxide layer. The polysilicon layer includes a thickness ranging from about 0.3 $\mu$m to about 1 $\mu$m, and preferably at about 0.5 $\mu$m. The polysilicon layer is also doped with N type dopants such as phosphorous or the like at a concentration ranging from about $10^{15}$ atoms/cm$^3$ to about $10^{19}$ atoms/cm$^3$, and preferably at about $10_{16}$ atoms/cm$^3$. Of course, the particular thicknesses and concentrations used depend upon the application.

A masking step defines the field plate layer to form each of the fixed field plates 125, 127, 131, 133, 135, and 137, and floating field plates 141, 143, 145, 147, 149, and 151. Another masking step defines each of the openings over the P type guard rings 102, 103, 105, 106, and 108. P+ type dopants may be implanted and diffused into each of the P type guard ring regions through the openings.

Figure 8:
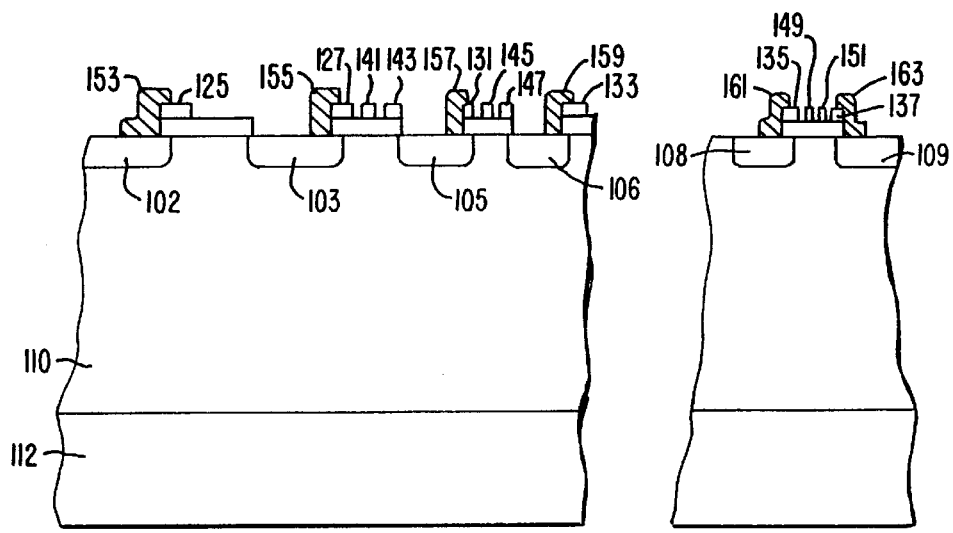

Contacts are formed on field plates 125, 127, 131, 133, 135, and 137 as illustrated by FIG. 8. Each of these contacts form overlying its respective P type guard ring 102, 103, 105, 106, and 108, and is also coupled to a top surface of a respective field plate 125, 127, 131, 133, and 135. Field plates 141, 143, 145, 147, 149, and 151 are "floating" that is, they do not connect to the guard rings. The completed structure often includes back metallization and surface passivation (both not shown) formed by conventional methods known in the art.

Figure 9:
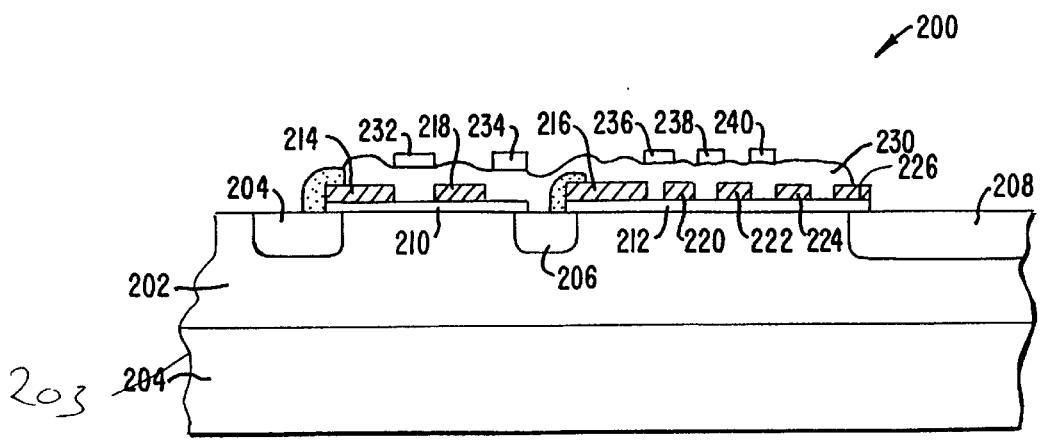
FIG. 9 is a simplified cross-sectional view of an alternative embodiment of a guard ring structure according to the present invention.

FIG. 9 is a simplified cross-sectional view of an alternative embodiment 200 of a guard ring structure according to the present invention. This embodiment uses P type main junction regions and P type guard rings formed onto an N– type epitaxial for illustrative purposes only. But it will be recognized that such an embodiment may also be formed with use of N type main junction regions and guard rings, and others. The embodiment includes an N– type layer 202 formed overlying a N+ type substrate 204. Preferably, the N– type layer is epitaxially formed overlying a neutron transmuted N+type substrate. Of course, the particular thicknesses and dopant concentrations will depend upon the application.

P type guard ring regions 204, 206, 208, and others form onto the N– type layer 202. A dielectric layer and field plate layer are also defined. The dielectric layer includes dielectric regions 210, 212, and others, and the field plate layer includes fixed plates 214 and 216. Floating field plates 218, 220, 222, 224, 226, and others are also defined by the field plate. The embodiment 200 also includes a dielectric layer 230 formed overlying a top surface of this structure, which may also be the structure of FIG. 7. An additional group of field plates 232, 234, 236, 238, 240, and others may be formed overlying such dielectric layer. Of course, the particular configuration used depends upon the application.

The embodiment of FIG. 9 is fabricated with additional process steps to the partially completed embodiment of FIG. 8. For example, a dielectric layer may be formed overlying the top surface of FIG. 8 embodiment. The dielectric layer includes dielectric materials such as silicon dioxide, silicon nitride, and others. Preferably, the dielectric layer is an oxide. The thickness of such a layer ranges from about 0.7 $\mu$m to about 2.0 $\mu$m, and preferably at about 1.0 $\mu$m.

A field plate layer made from materials such as polysilicon, metal, and others, is formed overlying the dielectric layer. The field plate layer is defined to form multiple field plates 232, 234, 236, 238, 240, and others. The thickness of such a field plate ranges from about 0.3 $\mu$m to about 1.0 $\mu$m, and preferably at about 0.55 $\mu$m. Preferably, each of the field plate regions is formed overlying an area between the underlying polysilicon regions 214, 216, 218, 220, 222, 224, 226, and others.

The multiple field plate layers of FIG. 9 further reduce the electric field in the underlying semiconductor, and lessen field concentration effects. Each of the field plates typically assumes a voltage potential between its surrounding guard rings. The configuration of multiple field plate layers provides for a more uniform distribution of electric fields in the semiconductor, thereby promoting higher voltage applications.

Figure 10:
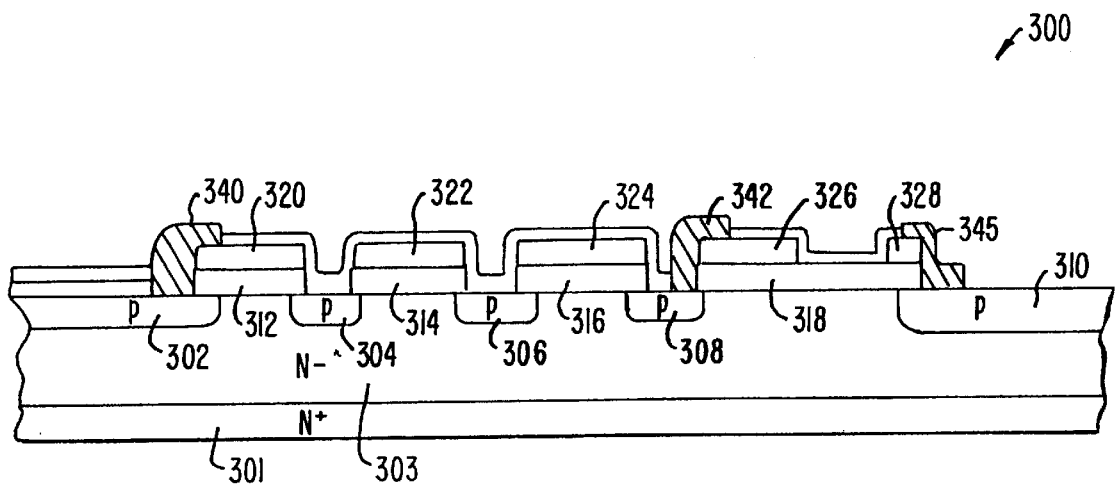
FIG. 10 is a simplified cross-sectional view of a further alternative embodiment of a guard ring structure according to the present invention.

In a further alternative embodiment 300, a guard ring structure includes multiple field plates that are allowed to "float" that is, they are not in contact with a guard ring region as illustrated by FIG. 10. The embodiment 300 includes an N– type layer 303 formed overlying an N+ type substrate 301. P type guard rings 304, 306, and 308 are defined in the N+ type layer. A scribe line 310 may also be defined at a peripheral region of the guard ring structure. Dielectric regions 312, 314, 316, and 318 are formed in regions between each of the P type guard rings.

The embodiment of FIG. 10 also includes multiple field plates, some of which float and others that do not float. A first field plate 302, typically nearest to the main junction region 302, is connected to the main junction region with use of a metal contact 340. A field plate 326 is also connected to a last guard ring region 308. Another field plate 328 is connected to the scribe line with use of contact 345. As for the remaining field plates, they are allowed to "float," that is, each is not connected to a guard ring. For example, field plates 322 and 324 do not connect to guard rings 304 and 306, respectively.

The floating field plate design lessens field concentration effects by reducing the potential between each field plate and its adjacent guard ring. For example, the potential between guard ring 306 and field plate 322 is less than a corresponding structure of FIG. 1. The potential between guard ring 308 and field plate 324 is also less than a corresponding structure of FIG. 1, and so on. By way of this structure, the potential between a field plate and its guard ring reduces by about 5% or greater.

Figure 11:
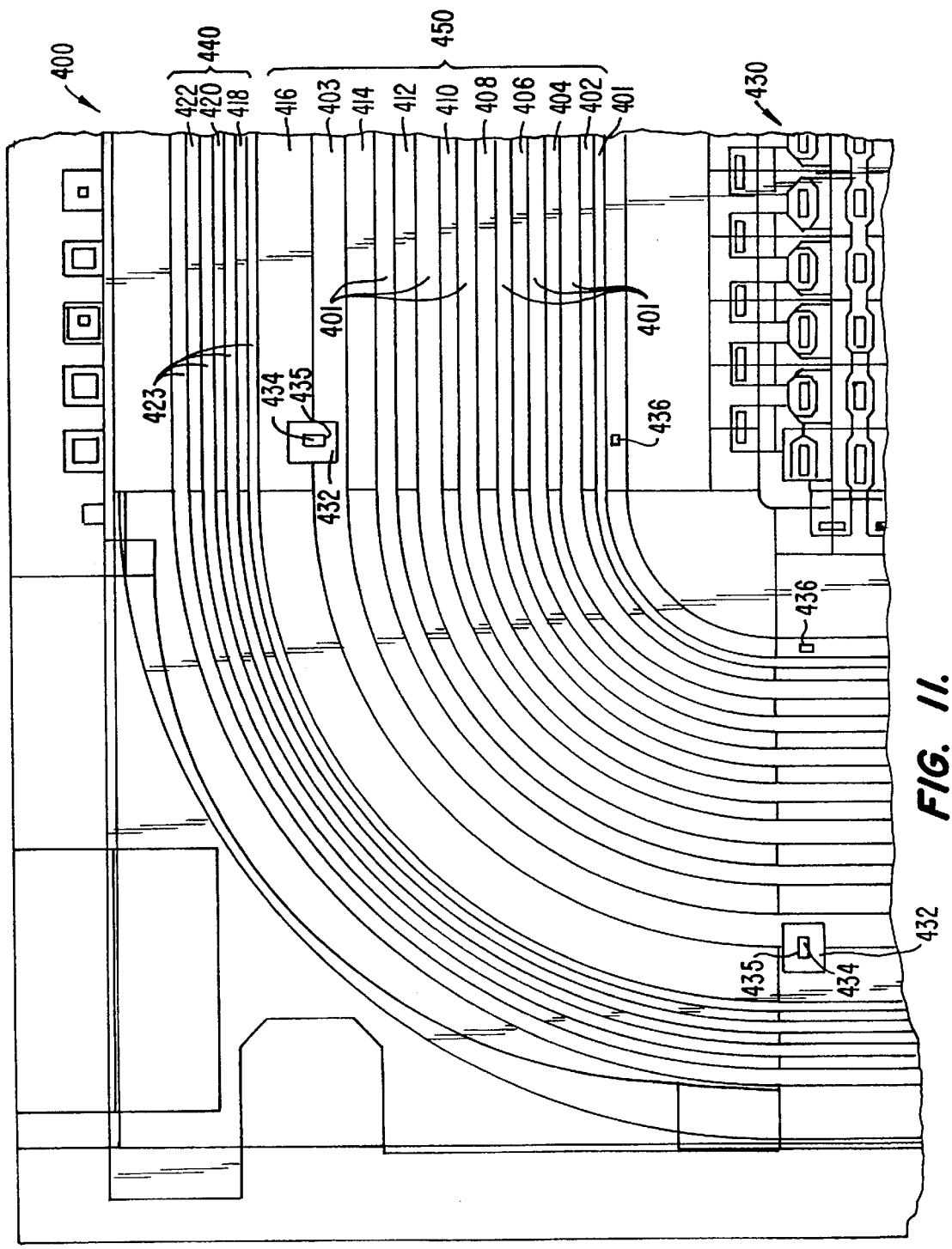
FIG. 11 is a simplified top-view diagram of still a further embodiment of guard ring structure according to the present invention.

FIGS. 11 is a simplified top-view diagram of an embodiment of the present invention. The top-view includes several types of field plate structures, core region 430, contacts 434, 436, metallization 432, and other structures. The field plates illustrated include floating field plates 402, 404, 406, 408, 410, 412, and 414 (collectively defined as reference numeral 450) and field plates 418, 420, and 422 (collectively defined as reference numeral 460) located in an annular region. Another field plate 416 connected to a guard ring region is also illustrated. Each of the floating field plates is not connected to an adjacent guard ring region 401. However, field plate 416 connects to an adjacent guard ring region 403 through contact 434, typically formed from metallization layer 434 and via structure 435. The other field plates 418, 420, and 422 are also floating, but do not have guard ring structure located in between. Each of the field plates 418, 420, and 422 often form overlying a dielectric layer 423 in the annular region. The combination of the field plate structures provide reduced electric fields, and therefore higher device breakdown voltages.

FIG. 2 is a simplified cross-sectional view of an alternative embodiment 500 according to the present invention using multiple dielectric layers. The embodiment includes P type guard rings 505, 507 formed onto an N type substrate 503. A first dielectric layer 509 is defined overlying each of the regions 515, 517 between the P type guard rings. A second dielectric layer 511 is defined overlying portions of the first dielectric layer. The combination of first and second dielectric layers includes a thinner region 519 near the main junction region, away from the scribe region of the integrated circuit. The embodiment includes an exposed first dielectric region near the main junction region to form a "step-like" structure. As previously noted, the dielectric layers can be formed from any suitable material such as silicon dioxide, silicon nitride, or the like, and combinations thereof. Field plates 513 are then defined overlying portions of the first and second dielectric layer.

The field plate portion overlying the first dielectric layer is closer to region 515 than the field plate portion defined over both the first and second dielectric layers. The structure provides the desired distribution of electric field on each of the field plates 513, thereby reducing the electric field in region 515. Any of previously mentioned embodiments may be modified by the structure of FIG. 12.

While the above is a full description of the specific embodiments, various modifications, alternative constructions, and equivalents may be used. For example, while the description above is in terms of P type guard ring regions, it would be possible to implement the present invention with a N type guard ring regions, or the like. Furthermore, while the embodiments shown are generally in terms of an MOSFET, thyristor, and IGBT, it would be possible to implement the improved substrate in the present invention with any device such as, for example, an MCT, or the like.

Therefore, the above description and illustrations should not be taken as limiting the scope of the present invention which is defined by the appended claims.

What is claimed is:

1. A power device, comprising:
   a semiconductor substrate comprising a top surface with an active region, a guard ring region, and a peripheral region, the active region including a junction region;
   a first guard ring formed into the semiconductor substrate in the guard ring region provided between the active region and the peripheral region;
   a second guard ring formed into the semiconductor substrate in the guard ring region, the second guard ring being provided between the first guard ring and the active region;
   a dielectric layer overlying the top surface; and
   a field plate layer including a portion that overlies the dielectric layer, the field plate layer including a first floating field plate, a first fixed field plate, and a second fixed field plate, the first floating field plate being provided between the first and second fixed field plates.

2. The device of claim 1, further comprising:
   a contact layer formed overlying a portion of the junction region and a portion of the field plate layer formed overlying the dielectric layer portion.

3. The device of claim 1, wherein the first floating field plate is not electrically coupled to the guard ring.

4. The device of claim 1, wherein the first fixed field plate is electrically coupled to the first guard ring and the second fixed field plate is electrically coupled to the second guard ring.

5. The device of claim 1, wherein the first fixed field plate is electrically coupled to the first guard ring and the second fixed field plate is electrically coupled to the second guard ring.

6. The device of claim 1, wherein the field plate layer is polysilicon.

7. The device of claim 1, wherein the guard ring includes a P type or P+ type diffusion region.

8. The device of claim 7, wherein the P type diffusion region has a concentration ranging from about $10^{14}$ atoms/$\mu m^3$ to about $10^{18}$ atoms/$\mu m^3$, and the P+ type diffusion region has a concentration ranging from about $10^{15}$ atoms/$\mu m^3$ to about $10^{19}$ atoms/$\mu m^3$.

9. A power device, comprising:
   a semiconductor substrate comprising a top surface with an active region, a guard ring region, and a peripheral region;
   a first guard ring formed into the semiconductor substrate in the guard ring region, the guard ring region being between the active region and the peripheral region;
   a second guard ring formed into the semiconductor substrate in the guard ring region, the second guard ring being provided between the first guard ring and the active region;
   a first fixed field plate electrically coupled to the first guard ring;
   a second fixed field plate electrically coupled to the second guard ring; and
   at least one floating field plate provided between the first and second fixed field plates.

10. The device of claim 9, further comprising:
    a dielectric layer overlying the substrate and having a portion underlying the fixed and floating field plates.

11. The device of claim 10, wherein the fixed and floating field plates are configured to provide a guard ring structure that reduces an electric field underlying a portion of the dielectric layer.

12. The device of claim 11, wherein the dielectric layer includes a first layer overlying the substrate and a second layer overlying the first layer.

13. The device of claim 12, wherein the at least one floating field plates includes at least two floating field plates, where one of the at least two floating field plates is provided on the first layer and another of the at least two floating field plates is provided on the second layer.

14. The device of claim 9, wherein the at least one floating field plate includes first and second floating field plate that are provided between the first and second fixed field plates.

15. The device of claim 9, wherein the first guard ring is provided adjacent to the second guard ring.

16. The device of claim 9, further comprising:
    a third guard ring formed into the semiconductor substrate in the guard ring region, the third guard being provided between the second guard ring and the active region;
    a third fixed field plate electrically coupled to the third guard ring; and
    a plurality of floating field plates being provided between the second and third fixed field plates.

17. A power device, comprising:
    a semiconductor substrate comprising a top surface with an active region, a guard ring region, and a peripheral region, the active region including a junction region;

a plurality of guard rings formed into the semiconductor substrate in the guard ring region, the guard ring region being between the active region and the peripheral region, the plurality of guard rings comprising a first guard ring nearest to the junction region and a last guard ring nearest to the peripheral region;

a dielectric structure overlying the top surface and including a first dielectric layer and a second dielectric layer; and a field plate structure having first and second fixed field plates electrically coupled to the first and last guard rings, respectively, and a plurality of floating field plates electrically isolated from the plurality of guard rings, wherein the plurality of floating field plates including a first floating field plate and a second floating field plate, the first floating field plate being provided on the first dielectric layer and the second floating field plate being provided on the second dielectric layer.

18. The device of claim 17, further comprising:

a contact overlying one of the plurality of guard rings to electrically couple the first fixed field plate to the first guard ring.

19. The device of claim 17, wherein the guard ring region includes a P type diffusion region.

* * * * *